May 5, 1953 M. P. HERRICK 2,637,808

OSCILLATOR FOR AM-FM RECEIVERS

Filed Nov. 16, 1949 2 SHEETS—SHEET 1

INVENTOR.
MALCOLM P. HERRICK
BY T. L. Bowes
ATTORNEY

May 5, 1953 M. P. HERRICK 2,637,808
OSCILLATOR FOR AM-FM RECEIVERS
Filed Nov. 16, 1949 2 SHEETS—SHEET 2

INVENTOR.
MALCOLM P. HERRICK
BY T. L. Bowes
ATTORNEY

Patented May 5, 1953

2,637,808

UNITED STATES PATENT OFFICE 2,637,808

OSCILLATOR FOR AM-FM RECEIVERS

Malcolm P. Herrick, Rochester, N. Y., assignor to Stromberg-Carlson Company, a corporation of New York Application November 16, 1949, Serial No. 127,609

7 Claims. (Cl. 250—20)

Figure 1:
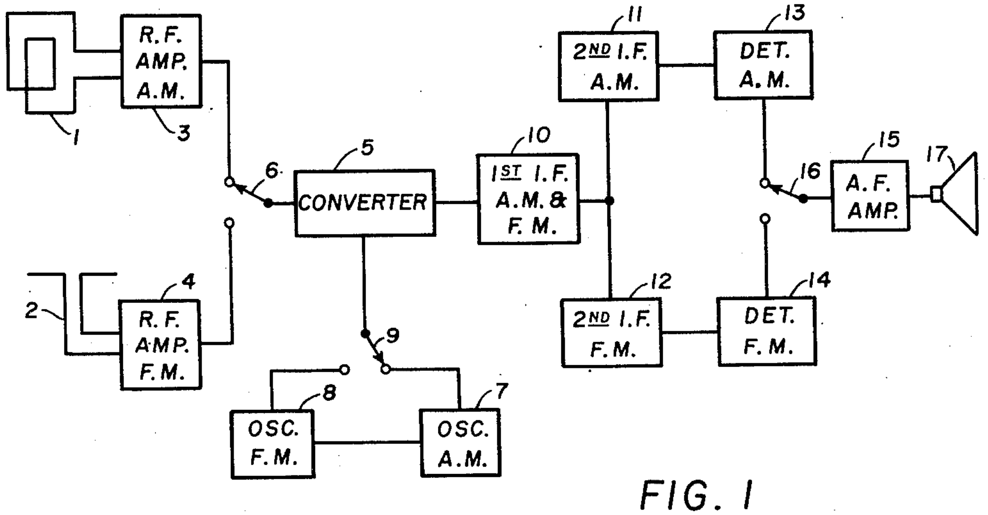

This invention relates to oscillator circuits for use in radio receiving sets of the superheterodyne type arranged to reproduce broadcasts, not only on the amplitude modulation broadcast band, but also the frequency modulation broadcast band.

The design of radio receivers for operation in both the amplitude modulation, or AM, broadcast band and the frequency modulation, or FM, broadcast band or, for that matter, in any two bands of frequencies separated by a substantial amount, raises certain problems for the circuit designer. It may be desirable to employ different tuned circuits for the oscillators used in connection with the two types of reception or two bands of frequencies involved.

In one arrangement used in the past, two completely separate converters or mixer stages have been used, each with its own tube or electron discharge device. Frequently, such designs include entirely separate radio frequency amplifiers for the amplitude and frequency modulated signals respectively. Such arrangements obviously increase the number of parts, the space required, and the cost of the chassis.

Another prior art practice is to use a single converter stage employing a tube of the pentagrid mixer type, for example, and to employ some type of switching to connect the desired oscillator tuned circuits to the tube. Known switching schemes have proven complex and relatively expensive. Furthermore, it has been difficult to arrange the various parts to avoid long leads and stray capacitance and inductance effects.

It is an object of my invention to provide a new and improved converter design for superheterodyne receivers of the AM-FM type using a minimum number of parts, occupying a minimum of space, and being relatively inexpensive.

Another object of my invention is to provide a new and improved converter design for superheterodyne receivers of the AM-FM type in which a single electron discharge device is employed and a minimum of switching means is required.

The foregoing objects of my invention are achieved in the preferred form by employing in a converter a pentagrid mixer tube and two oscillator circuits, and a single-pole double-throw switch for connecting one or the other of the tuned circuits to one of the signal grids or control electrodes of the mixer tube. During operation of the receiver on the FM broadcast band, the cathode of the tube is returned to ground through a choke coil and through the feedback turns of the AM oscillator. Feedback is obtained through a suitable capacitor voltage-divider network and choke 33. When the receiver is used to receive signals broadcast in the AM band, the choke has negligible impedance, but the feedback turns of the AM oscillator have appreciable impedance over the AM band and feedback is obtained through the feedback turns. Thus, the oscillators are inter-connected, i. e., each has a portion included in the feedback circuit of the other, and each portion is so proportioned as to be effective during the operation of the oscillator of which that portion forms a part but is substantially ineffective during the operation of the other oscillator with respect to the production of oscillations by the other oscillator.

The features of my invention which I believe to be novel are set forth with particularity in the appended claims. My invention itself, both as to its organization and manner of operation, together with further objects and advantages thereof, may best be understood by reference to the following description taken in connection with the accompanying drawing in which Fig. 1 represents in block diagram fashion a receiver employing the principles of my inventoin, Fig. 2 shows a preferred form of the converter stage shown in Fig. 1, Fig. 2*a* shows a modification of the circuit of Fig. 2, Fig. 3 shows in block diagram fashion another form of my invention, and Fig. 4 discloses a modification of the circuit shown in Fig. 2.

Referring to Fig. 1, there is illustrated an AM-FM receiver of the superheterodyne type. AM signals may be picked up on a suitable antenna such as a loop antenna 1, for example, and FM signals may be picked up on a suitable antenna such as a dipole 2. The received signals may be amplified at radio frequencies by means of suitable radio frequency amplifiers 3 and 4, respectively. The amplified radio frequency signals may be applied to a converter stage 5 through a suitable switching device 6. There are provided suitable oscillators 7 and 8 for the AM and FM signals, respectively, and the output of one or the other of the oscillators may be selectively introduced into the converter stage 5 through a suitable switching device 9. The output of converter 5 may be introduced into a suitable first intermediate frequency amplifier stage 10 and the output of the first intermediate frequency amplifier stage may be connected to second intermediate frequency amplifier stage 11 or 12 for the AM and FM signals, respectively, and thereafter detected in suitable AM detector 13 or FM detector 14, respectively. The detected signals may be applied to a suitable audio frequency amplifier 15 through a suitable switching device 16, and after amplification, reproduced in a suitable reproducer such as loudspeaker 17.

Figures 2, 2A:
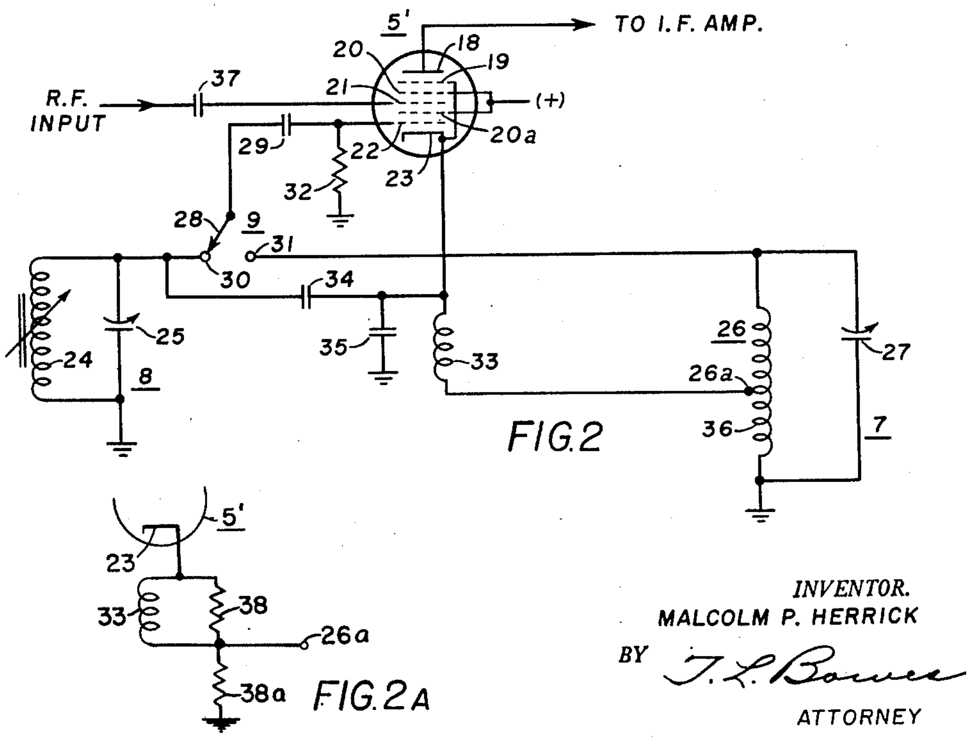
Figure 3:
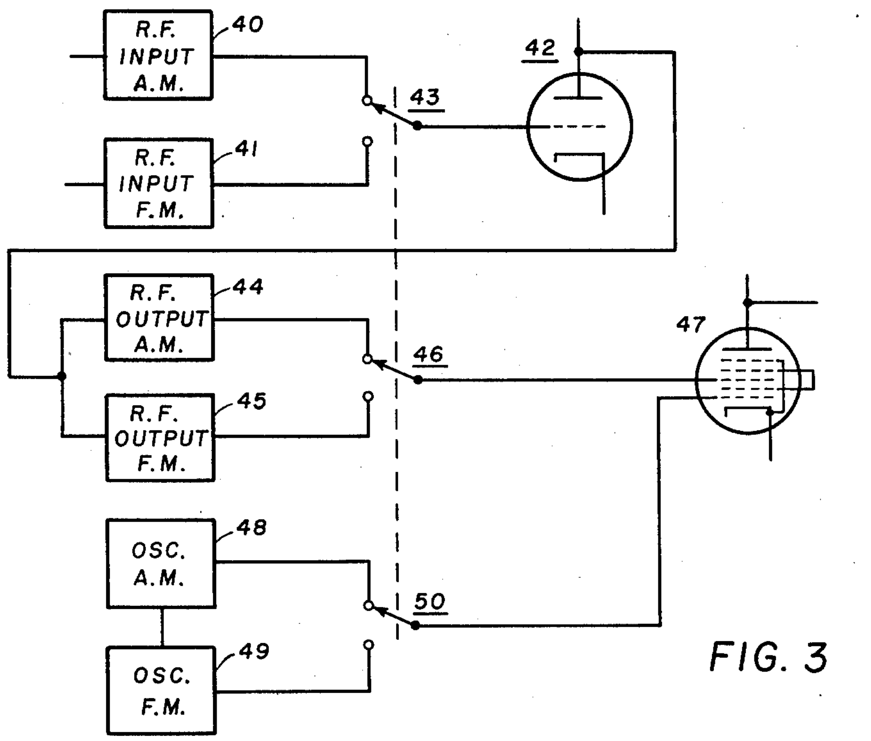

In Fig. 2 there is illustrated circuit connections for the converter stage 5 including oscillator portions or tuned circuits 7 and 8. Converter stage 5 may comprise a suitable electron discharge device 5' which is illustrated as being of the pentagrid mixer type, and may comprise an anode 18, suppressor grid 19, screen grids 20 and 20*a*, signal grids or control electrodes 21 and 22, and cathode 23. Grids 22 and 20*a* cooperate with either tuned circuit 7 or 8 to constitute local oscillators.

In order to provide oscillations over the frequency modulation broadcast band, there is provided oscillator portion 8 of the Colpitts type having a suitable inductance device 24 shunted by a variable capacitor 25. Inductance device 24 may be of the permeability-tuned type, in which case capacitor 25 may be of the fixed type. One of the common connections is connected to ground as shown.

In order to provide oscillations over the amplitude-modulated broadcast band, oscillator portion 7 is illustrated as being of the Hartley type having a tapped inductance device 26 shunted by variable capacitor 27. One of the common connections of inductance device 26 and capacitor 27 is connected to ground.

In order to complete the oscillator circuits and to connect the oscillators to the converter tube 5', means is provided for connecting the ungrounded or common connection of either oscillator to control electrode 22. In the preferred form of my invention, such means comprises a single-pole double-throw switch 9. The movable member or arm 28 of switch 9 is connected to control electrode 22 through a suitable coupling capacitor 29. In the position shown for switch 9, FM oscillator 8 is connected to control grid 22 by reason of the engagement of armature or contact member 28 with terminal 30. For AM operation, contact member or arm 28 is moved to engage terminal 31 which in turn is connected to the ungrounded common connection of winding 26 and capacitor 27 of oscillator 7. A suitable bias resistor 32 is connected between control electrode 22 and ground.

Cathode 23 of discharge device 5' is connected to one end of a suitable radio frequency choke 33 and also to the voltage divider comprising capacitors 34 and 35 at the common terminals thereof in order to provide a feedback path for oscillator 8. The other terminal of capacitor 34 is connected to the ungrounded end of oscillator 8 and the other terminal of capacitor 35 is grounded. The low potential end of choke 33 is connected to tap 26*a* of inductance 26, i. e., to ground through the feedback portion 36 of inductance 26.

Screen grids 20 and 20*a* are connected to a suitable source of positive potential and the suppressor grid 19 is connected to cathode 23. Anode 18 is connected to a suitable output circuit as, for example, to the first stage of intermediate frequency amplification. The radio frequency input is applied to the other signal grid or control electrode 21 through a suitable coupling capacitor 37.

The inductance of choke 33 is so chosen that negligible impedance is presented over the AM band frequencies but provides a voltage drop or feedback voltage when signals are received over the FM broadcast band. The values of capacitance for capacitors 34 and 35 are chosen to provide negligible effect on the amplitude modulation band, i. e., the network comprising capacitors 34 and 35 should have an impedance much larger than that of turns 36. The feedback turns 36 are preferably arranged so that the distributed capacity of turns 36 is low enough to have substantially no effect upon the operation of the oscillator 8 and constitutes a virtual short-circuit at the frequencies employed on the FM band, thereby permitting the desired feedback on FM signals. It is not necessary that the feedback turns be arranged to constitute a short circuit in the FM band if the lower end of choke 33 can be permitted to have a potential above ground. With the above arrangement, on frequency modulated signals, the cathode 23 is returned to ground through choke 33 and turns 36, capacitor 35 providing the necessary feedback.

When signals broadcast on the AM band are being received, the cathode, in effect, is connected directly to tap 26*a* inasmuch as choke 33 has substantially no impedance at the AM frequencies. Moreover, inductance 24 has substantially no impedance at AM band frequencies, so that capacitors 34 and 35 are disposed in parallel to ground and shunt coil 36. Thus neither choke 33 nor inductance 24 nor capacitors 34 and 35 adversely affects oscillation of oscillator 7.

In some cases, to avoid spurious responses resulting from stray tuned circuits during operation as a frequency modulated receiver it may be desirable to shunt choke 33 with a suitable resistance 38, as indicated in Fig. 2*a*. Similarly, suitable resistance 38*a* may be connected across feedback turns 36 in connection with amplitude modulation reception.

In one receiver employing the principles of my invention, a type 6BE6 tube was used as the converter tube 5', and the following values for circuit components were employed:

| | |
|---|---|
| Capacitor 29 | 50 micromicrofarads |
| Capacitor 34 | 24 micromicrofarads |
| Capacitor 35 | 24 micromicrofarads |
| Choke 33 | 3 microhenrys |
| Resistor 32 | 33,000 ohms |

Fig. 3 represents a modification of my invention employing different radio frequency input circuits 40 and 41 for the AM and FM bands, respectively, although a single electron discharge device 42 is employed, circuits 40 and 41 being connected, selectively, to the control electrode of tube 42 through a suitable switch 43. The output of tube 42 is applied to radio frequency output circuits 44 and 45 for the AM and FM channels, respectively, and switch 46 is employed to apply the output of either circuit 44 or 45 to mixer tube 47. An AM oscillator 48 or an FM oscillator 49 arranged in accordance with my invention as described above may be connected to mixer tube 47 through a suitable switch 50. The switches 43, 46 and 50 may be connected for movement together as indicated by the dashed line.

Figure 4:
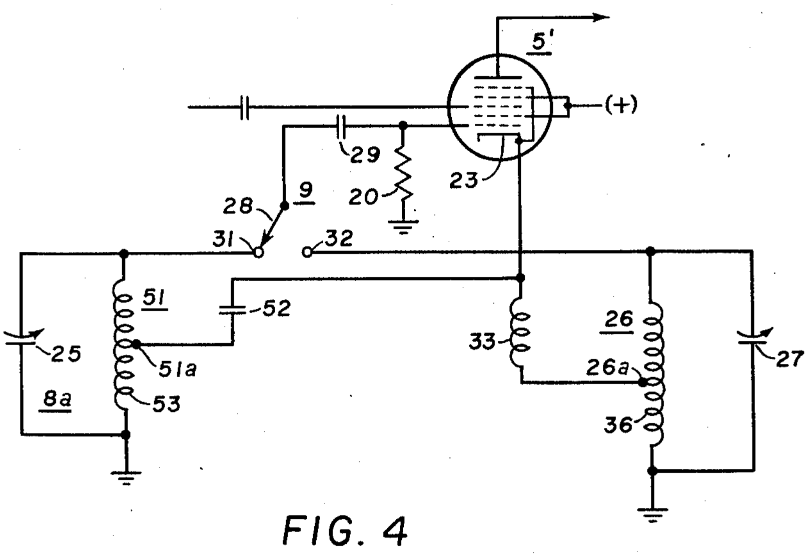

In Fig. 4 there is shown an embodiment of my invention utilizing two oscillators of the Hartley type. Thus oscillator 8*a* for the FM band may comprise capacitor 25 and tapped inductance 51. Tap 51*a* is shown connected to cathode 23 through a suitable capacitor 52. The feedback turns are represented by numeral 53.

Other modifications will occur to those skilled in the art. For example, different arrangements of the radio frequency portion of the receiver may be made and, if desired, the radio frequency amplifiers may be omitted.

While I have shown and described a particular embodiment of my invention, it will be obvious to those skilled in the art that changes and modifications may be made without departing from my invention in its broader aspects. I, therefore, aim in the appended claims to cover all such changes and modifications as fall within the true spirit and scope of my invention.

What is claimed is:

1. In a superheterodyne receiver, an electron discharge device including at least a pair of control electrodes, an anode and a cathode; a source of radio frequency signal connected to one of said control electrodes; a first oscillator circuit including said discharge device for operation over a first range of frequencies; a second oscillator circuit including said discharge device for operation over a second range of frequencies; means for connecting one end of one or the other of said oscillator circuits to the other of said control electrodes; said oscillator circuits having parallel returns to said cathode, one of said returns including a choke coil of such value that it constitutes a choke in the first range of frequencies but has substantially no impedance in the second range of frequencies; and means for returning the other ends of said oscillator circuits to said anode.

2. In a superheterodyne receiver, an electron discharge device including at least a pair of control electrodes, an anode and a cathode; a source of radio frequency signal connected to one of said control electrodes; a first oscillator circuit including said discharge device for operation over a first range of frequencies; a second oscillator circuit including said discharge device for operation over a second range of frequencies higher than said first range; means for connecting one end of one or the other of said oscillator circuits to the other of said control electrodes; said oscillator circuits having parallel returns to said cathode, the cathode return of said first oscillator circuit including a choke coil of such value that it constitutes a choke in the second range of frequencies but has substantially no impedance in the first range of frequencies, a voltage dividing network comprising a pair of capacitors connected across said second oscillator circuit, the common terminal between said capacitors being connected to said cathode; and means for returning the other ends of said oscillator circuits to said anode.

3. In a radio receiver, an electron discharge device including at least a pair of control electrodes and a cathode; a first oscillator circuit for use in receiving amplitude modulated signals comprising a tapped inductance shunted by a capacitor, one common connection of said capacitor and said inductance being connected to ground; a second oscillator circuit for use in receiving frequency modulated signals comprising an inductance shunted by a capacitor, one common connection thereof being connected to ground; means for connecting selectively one or the other of the ungrounded common connections of said oscillator circuits to one of said control electrodes; a source of radio frequency signals; means for applying said signals to the other of said control electrodes; a voltage dividing network comprising a pair of capacitors connected in series across said second oscillator circuit; means for connecting the junction point of said pair of capacitors to said cathode; and a choke coil connected between said cathode and the tap of said tapped inductance, said choke coil being of such a value that it serves as a choke at the frequencies of said frequency modulated signals but has substantially no impedance at the frequencies of said amplitude modulated signals.

4. In a radio receiver, an electron discharge device including at least a pair of control electrodes and a cathode; a first oscillator circuit for use in receiving amplitude modulated signals comprising a tapped inductance shunted by a capacitor, one common connection of said capacitor and said inductance being connected to ground; a second oscillator circuit for use in receiving frequency modulated signals comprising an inductance shunted by a capacitor, one common connection thereof being connected to ground; means for connecting selectively one or the other of the ungrounded common connections of said oscillator circuits to one of said control electrodes; a source of radio frequency signals; means for applying said signals to the other of said control electrodes; a voltage dividing network comprising a pair of capacitors connected in series across said second oscillator circuit; means for connecting the junction point of said pair of capacitors to said cathode; a choke coil connected between said cathode and the tap of said tapped inductance, said choke being of such a value that it serves as a choke at the frequencies of said frequency modulated signals but has substantially no impedance at the frequencies of said amplitude modulated signals, and that portion of said tapped inductance between said tap and ground having substantially no impedance at the frequencies of said frequency modulated signals.

5. In a radio receiver, an electron discharge device including at least a pair of control electrodes and a cathode; a first oscillator circuit for use in receiving amplitude modulated signals comprising a tapped inductance shunted by a capacitor, one common connection of said capacitor and said inductance being connected to ground; a second oscillator circuit for use in receiving frequency modulated signals comprising an inductance shunted by a capacitor, one common connection thereof being connected to ground; means for connecting selectively one or the other of the ungrounded common connections of said oscillator circuits to one of said control electrodes; a source of radio frequency signals; means for applying said signals to the other of said control electrodes; a voltage dividing network comprising a pair of capacitors connected in series across said second oscillator circuit; means for connecting the junction point of said pair of capacitors to said cathode; a choke coil connected between said cathode and the tap of said tapped inductance, said choke coil being of such a value that it serves as a choke at the frequencies of said frequency modulated signals but has substantially no impedance at the frequencies of said amplitude modulated signals, and said capacitors being of such capacity that said network has a relatively large impedance at the frequencies of said amplitude modulated signals.

6. In a radio receiver, an electron discharge device including a pair of control electrodes, an anode and a cathode; a first tuned circuit for use in receiving amplitude modulated signals; a second tuned circuit for use in receiving frequency modulated signals; means for connecting one end of one or the other of said tuned circuits to one of said control electrodes; a source of radio frequency signals; means for applying said radio frequency signals to the other of said control electrodes; said tuned circuits having parallel returns to said cathode, the cathode return of said first tuned circuit including a choke coil of such value that it serves as a choke at the frequencies of said frequency modulated signals but has substantially no impedance at the frequencies of said amplitude modulated signals; and means for returning the other ends of said tuned circuits to said anode.

7. In a radio receiver, an electron discharge device including a pair of control electrodes, an anode and a cathode; a first tuned circuit for use in receiving amplitude modulated signals; a second tuned circuit for use in receiving frequency modulated signals; means for connecting one end of one or the other of said tuned circuits to one of said control electrodes; a source of radio frequency signals; means for applying said radio frequency signals to the other of said control electrodes; said tuned circuits having parallel returns to said cathode, the cathode return of said first tuned circuit including a choke coil of such value that it serves as a choke at the frequencies of said frequency modulated signals but has substantially no impedance at the frequencies of said amplitude modulated signals, and a voltage dividing network comprising a pair of capacitors connected across said second oscillator circuit; and means for returning the other ends of said tuned circuits to said anode.

MALCOLM P. HERRICK.

References Cited in the file of this patent

UNITED STATES PATENTS

| Number | Name | Date |
|---|---|---|
| 2,296,100 | Foster et al. | Sept. 15, 1942 |
| 2,354,959 | McCoy | Aug. 1, 1944 |
| 2,443,935 | Shea | June 22, 1948 |
| 2,525,053 | Vilkomerson | Oct. 10, 1950 |
| 2,538,717 | Weber | Jan. 16, 1951 |